United States Patent
Griffin (10) Patent No.: US 11,735,285 B1
(45) Date of Patent: Aug. 22, 2023

(54) DETECTION OF ADDRESS BUS CORRUPTION FOR DATA STORAGE DEVICES

(71) Applicant: Kioxia Corporation, Tokyo (JP)

(72) Inventor: Jason Griffin, Milton (GB)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/200,528

(22) Filed: Mar. 12, 2021

(51) Int. Cl.
*G11C 29/42* (2006.01)
*G11C 29/44* (2006.01)
*G11C 29/00* (2006.01)
*G11C 29/18* (2006.01)

(52) U.S. Cl.
CPC .............. *G11C 29/42* (2013.01); *G11C 29/18* (2013.01); *G11C 29/44* (2013.01); *G11C 29/76* (2013.01); *G11C 2029/1802* (2013.01)

(58) Field of Classification Search
CPC .......... G11C 29/42; G11C 29/10; G11C 29/14
See application file for complete search history.

(56) References Cited

U.S. PATENT DOCUMENTS

| | | | | |
|---|---|---|---|---|
| 5,943,287 A * | 8/1999 | Walton | ................ | G11C 29/70 365/230.03 |
| 2011/0041030 A1* | 2/2011 | Ko | ................ | H03M 13/095 714/752 |
| 2011/0041031 A1* | 2/2011 | Ko | ................ | G06F 11/1016 714/752 |
| 2019/0370114 A1* | 12/2019 | Troia | ................ | G06F 11/1417 |
| 2020/0371960 A1* | 11/2020 | Bhoria | ................ | G11C 7/1087 |
| 2022/0100601 A1* | 3/2022 | Baum | ................ | G06N 3/02 |
| 2022/0182340 A1* | 6/2022 | Kawamura | ........ | H04L 49/9057 |

* cited by examiner

*Primary Examiner* — Tuan T Nguyen
(74) *Attorney, Agent, or Firm* — Foley & Lardner LLP (57) ABSTRACT

Various implementations described herein relate to systems and methods for detecting address corruption when using a memory device to store and retrieve data, including but not limited to, reading combined information from a memory device, determining encoded data by de-combining address information from the combined information, and detecting address corruption by decoding the encoded data.

21 Claims, 3 Drawing Sheets

DETECTION OF ADDRESS BUS CORRUPTION FOR DATA STORAGE DEVICES

TECHNICAL FIELD

The present disclosure generally relates to systems, methods, and non-transitory processor-readable media for detecting errors caused by address bus corruption in data storage devices.

BACKGROUND

In a system that interfaces with an external memory such as but not limited to, a Double Data Rate (DDR) Synchronous Dynamic Random-Access Memory (SDRAM), errors are likely induced on a physical interface between the system and the external memory. Accordingly, signal integrity on the physical interface is typically designed to be as high as possible. However, the speeds associated with recent DDR technology (e.g., DDR4 and beyond) may limit the ability to provide an error-free channel. In that regard, DDR4 is the first standard of the DDR generations to state a Bit Error Rate (BER) and Receiver (Rx) Mask for the data bus.

In addition to reducing errors in the data bus that operates at DDR, corruption of the Command/Address (CA) bus signals should also be reduced, even if the CA bus operates at Single Data Rate (SDR). Address bus signal corruption can cause data to be written to the wrong location, or data to be read from the wrong location. In high-capacity systems, the CA bus can become heavily loaded, for example, with multiple physical ranks. High-performance and high-capacity systems can be formed from more instances of smaller packages (e.g. 8 off×8 packages for each rank of a 64-bit data bus), thus increasing the electrical and capacitive load. The increased load may impact the bus signal eye diagram and decision margin. Design techniques such as 2T/3T timing can provide additional margin for some CA signals. Other methods based on most costly PCBs and improved PCB layout and SI tuning can be used. With that said, other needs may take priority.

For example, although Error Correction Code (ECC) can be implemented in memory systems to protect data from errors, measures that exist in conventional memory systems fail to adequately detect and protect address information carried on address bus signals from corruption. In particular, some memory technologies have optional modes (e.g., DDR4 CA parity scheme) that allow for single-bit error detection on address information. Such modes have significant drawbacks, including but not limited to, more latency to account for the time needed to perform the check, more restrictions on timing and other features, additional Input/Output (I/O) operations that impact power and package, additional signals to route having impact on Printed Circuit Board (PCB) and signal integrity, asynchronous alert feedback path from the SDRAMs that needs to be "trained" in order to link the alert to the offending transaction, out-of-band error-handling which needs to query each SDRAM package to located the error and to perform error handling, and so on. In the DDR4 CA parity scheme, error handling becomes difficult when all commands from the point at which parity check fails are dropped, such that the exact state of the memory system prior to detecting the error needs to be re-instated, and the traffic needs to be replayed. In that regard, the DDR4 CA parity scheme was dropped from DDR5.

SUMMARY

In some arrangements, systems, methods, and non-transitory computer-readable media relate to detecting and correcting errors in address information, including reading the combined information from the memory device, determining the encoded data by de-combining the address information from the combined information, and detecting address corruption by decoding the encoded data. In some arrangements, encoded data is determined by encoding data. The combined information is determined by combining the encoded data with address information corresponding to the data. The combined information is written into the memory device.

In some arrangements, the data is encoded using one or more ECCs to determine the encoded data. The encoded data is decoded using the one or more ECCs to determine the data.

In some arrangements, the data is encoded before the encoded data and the address information is combined. The encoded data is decoded after the address information is de-combined from the combined information.

In some arrangements, the address information is passed through a translation function before being combined with the encoded data. In some examples, the address information inputted into the translation function has a first width. The address information outputted from the translation function has a second width. The first width is different from the second width. In some examples, the translation function is one of a non-cryptographic hashing function or a parity function.

In some arrangements, the address information is passed through a delay queue before being combined with the encoded data. In some examples, the delay queue is one of a delay First In First Out (FIFO), a variable-length pipeline, or a fixed-length pipeline. In some examples, combining the encoded data with the address information includes superimposing the address information unto the encoded data using a first function. The address information and the encoded data are inputs to the first function, and the combined information is the output of the first function.

In some examples, de-combining the address information from the combined information is based on a second function. The address information and the combined information are inputs to the second function, and the encoded data is the output of the second function.

DETAILED DESCRIPTION

In a storage system, address information (e.g., address bits) and data corresponding to the address information are communicated via signals on one or more buses and used by a memory device to store and retrieve data located in a memory device. Conventionally, in situations in which an address bus signal becomes corrupted or mis-sampled at the memory device, the data may be stored at the wrong location or (wrong) data retrieved from the wrong location even though the data passes ECC checks (depending on the ECC scheme). Either error may cause the incorrect (wrong) data to be retrieved, because in the case of data being stored at the wrong location, the old data at the correct location remains intact, therefore when reading the location again, the old (incorrect) data is retrieved instead of the new (correct) data which is now located elsewhere at the wrong location, overwriting the old data at that location. At the same time, when the wrong location is then read, instead of its original (correct) data being read, the new (incorrect for that location) is read instead. While it may be possible to add extra signals and checking to the address bus, such mechanism may negatively affect the efficiency and cost of the storage system.

In that regard, arrangements described herein relate to determining combined information (or superimposed information) by combining (e.g., superimposing or encoding) data with address information, and storing the combined information in the memory device. By combining the address information in with the data, errors in the address information can be detected as data errors without adding additional external signals. Accordingly, the implementation cost is inexpensive and requires no modifications or changes to the memory devices.

In some arrangements, a version of the address information of memory write and read operations is combined with the data corresponding to the address information. In particular, an ECC scheme, which conventionally protects only the data and not the address information, can be employed to detect errors in the address information that may otherwise be undetected to detect errors induced on the address information used in memory read and write accesses. Furthermore, when writing and reading fixed user data patterns across an address range, by altering the fixed user data, the superimposed address information can spread the energy across the frequency spectrum, thus improving radiated Electromagnet Interference (EMI) during non-random patterns.

Figure 1:
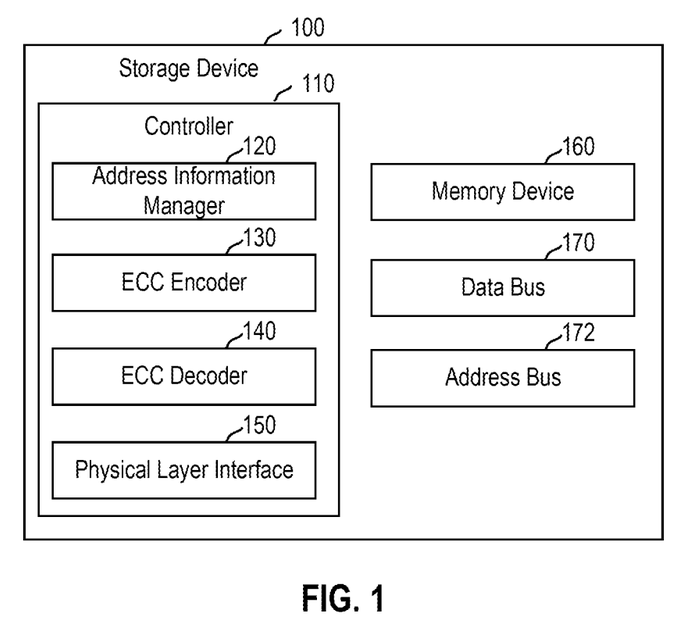
FIG. 1 is a block diagram illustrating an example storage device, according to some implementations.

To assist in illustrating the present implementations, FIG. 1 shows a block diagram of a storage system, according to some implementations. Referring to FIG. 1, the storage device 100 may be operatively coupled to a user device (not shown) that is operated by a user. The user device, which can be a host, communicates with the storage device 100 (e.g., a controller 110 of the storage device 100) over a suitable wired or wireless communication link, bus, and/or network to manage storage of data in the storage device 100. The storage device 100 includes at least a controller 110, a memory device 160, a data bus 170, and an address bus 172. Other components of the storage device 100 are not shown for brevity.

The memory device 160 is any device capable of storing data, where the operations of the memory device 160 is controlled by the controller 110. In some arrangements, the memory device 160 can be a suitable volatile memory such as but not limited to, Dynamic Random Access Memory (DRAM), SDRAM, Static Random-Access Memory (SRAM), and so on. In other arrangements, the memory device 160 can be a suitable non-volatile memory such as but not limited to, a NAND flash memory device, Magnetic Random Access Memory (MRAM), Phase Change Memory (PCM), Ferro-Electric RAM (FeRAM), and so on.

In some examples, the memory device 160 is a memory device local to or operatively coupled to the controller 110. For instance, the memory device 160 can be an on-chip memory located on the chip of the controller 110. In some examples, the memory device 160 can be implemented using a memory device of the storage device 100 external to the controller 110. For instance, the memory device 160 can be a memory device located on a chip other than the chip of the controller 110.

The controller 110 can include microcontrollers, error correction systems, interface for communicating with the user device, interface for communicating with the memory device 160, and so on. For example, as shown, the controller 110 includes an address information manager 120, an ECC encoder 130, an ECC decoder 140, and a physical layer interface 150. While shown as a part of the controller, in some implementations, one or more of the address information manager 120, the ECC encoder 130, the ECC decoder 140, and the physical layer interface 150 can be in whole or in part external to the controller 110. Other components of the controller 110 are not shown. The functions of the controller 110 can be implemented in hardware, software, and firmware or any combination thereof.

The controller 110 includes suitable processing and memory capabilities (e.g., one or more Central Processing Units (CPUs)) for executing functions described herein, among other functions. The controller 110 manages various features including, but not limited to, I/O handling, reading, writing/programming, erasing, monitoring, logging, error handling, garbage collection, wear leveling, data protection (encryption/decryption, Cyclic Redundancy Check (CRC)), ECC, data scrambling, and the like. Each of the address information manager 120, the ECC encoder 130, the ECC decoder 140, and the physical layer interface 150 is implemented using the processing and memory capabilities of the controller 110.

The controller 110 receives write data to be written to the memory device 160 from the user device (e.g., a host) and writes/programs the write data into the memory device. The controller 110 may also use the memory device 160 to read and write its own data for its own purposes, independent of any user device or host. Examples of such data are metadata associated with the write data from the user device, performance or error log data and so on. Address information corresponding to the write data can be received by the controller 110 from the user device or another storage device, translated by the controller 110, or otherwise determined by the controller 110. The address information (e.g., address bits) denotes a memory location to which the write data is to be written. For example, the address bits can specify DRAM rank, bank (group), row, and column addresses. The controller 110 can read data stored in the memory device 160 that is stored in the memory location specified by the address information, and provide the read data to the user device or to another component (e.g., another memory device) of the storage device 100 or another storage device.

The address information manager 120 refers to hardware, software, and firmware configured to perform the functions of the address information manager 120 as described herein. As an example, the address information manager 120 can be used to implement the translation function 210, the delay queue 212, and the delay queue 216 shown in FIG. 2. In some arrangements, the address information manager 120 can translate the address information using a suitable translation function in a write operation and a read operation, and delay the translated address information into a data phase using delay queues in a write operation and a read operation.

The error correction system can include or otherwise implement one or more ECC encoders (referred to as the ECC encoder 130) and one or more ECC decoders (referred to as the ECC decoder 140). The encoder ECC 130 is configured to encode data (e.g., input payload) to be programmed to the memory device 160 using at least one suitable ECC. The ECC decoder 140 is configured to decode the encoded data to correct programming errors, errors caused by reading with non-optimal thresholds, errors caused by retention/read-disturb stresses, and so on, in connection with a read operation.

The physical layer interface 150 can include, or be operatively coupled to, to the memory device 160 and memory locations thereof. The physical layer interface 150 includes scheduler logic (e.g., a scheduler) that controls scheduling of memory commands/operations (e.g., write commands, read commands, refresh commands and so on) with respect to the memory device 160. For example, the physical layer interface 150 takes a memory command (e.g., write/program or read), schedules the command on the memory locations of the memory device 160, performs control signaling and data transfers to the memory locations, and so on. In one example, the physical layer interface 150 converts control commands of the controller 110 into signals for the pins corresponding to the memory locations of the memory device 160, to program or read data.

The data bus 170 is used to transfer data (e.g., data bits) among components of the controller 110 and the memory device 160. The address bus 172 is used to transfer address information (e.g., address bits) among components of the controller 110 and the memory device 160. Each of the data bus 170 and the address bus 172 can be a physical or virtual/software channel or bus. For example, each of the data bus 170 and the address bus 172 can include one or more wires, one or more flip-flops, components on a semiconductor device, software queues, and so on. The data bus 170 and the address bus 172 may have different widths that correspond to different number of bits that can be communicated at a given time.

Figure 2:
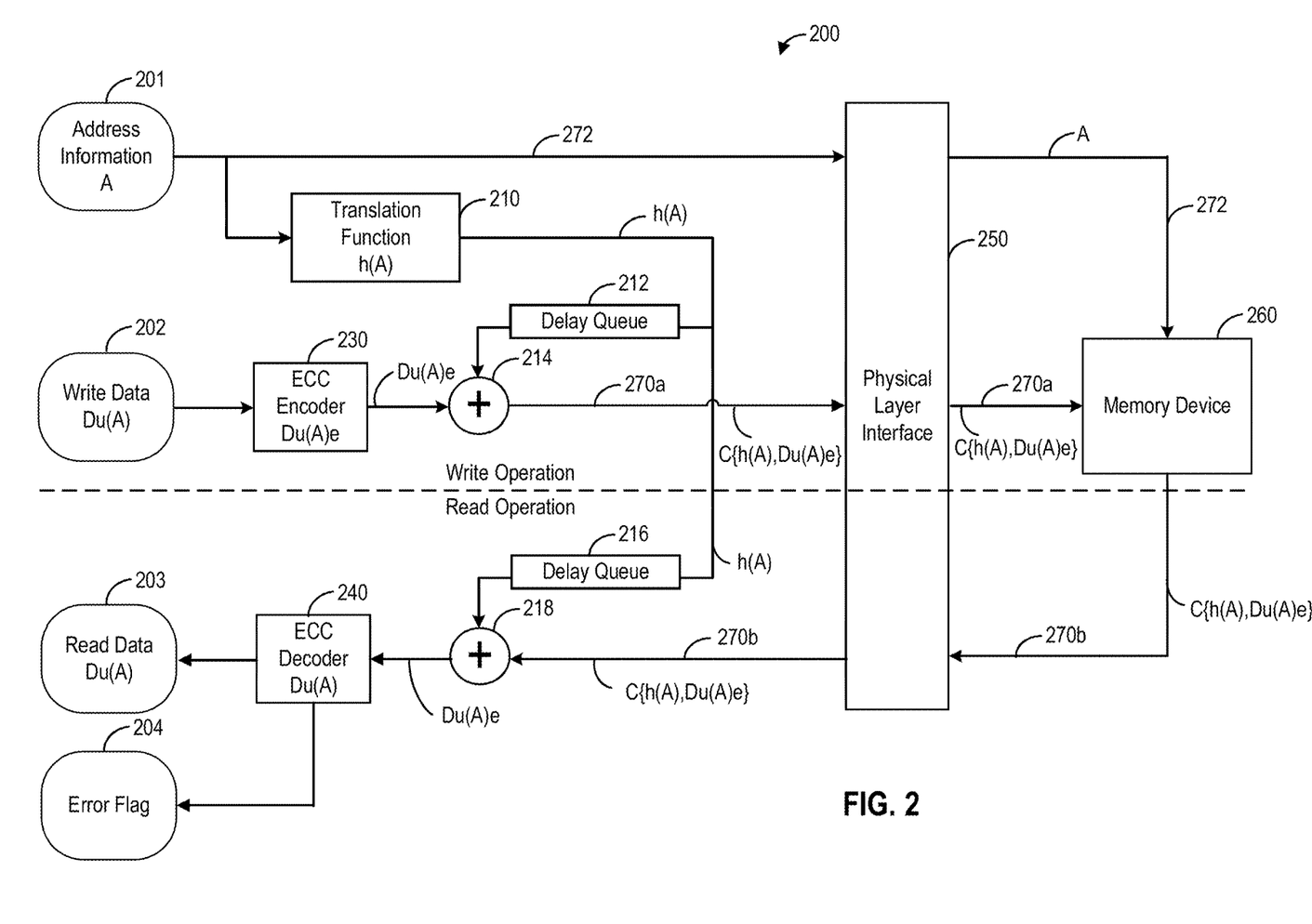
FIG. 2 is a block diagram illustrating an example storage device performing a read operation and a write operation, according to some implementations.

FIG. 2 is a block diagram illustrating an example storage system 200, according to various arrangements. Referring to FIGS. 1 and 2, the storage system 200 is an example implementation of the storage system 100. For example, the address information manager 120 includes the translation function 210, the delay queue 212, the delay queue 216, and so on. The ECC encoder 130 corresponds to the ECC encoder 230. The ECC decoder 140 corresponds to the ECC decoder 240. The physical layer interface 150 corresponds to the physical layer interface 250. The memory device 160 corresponds to the memory device 260. The data bus 170 corresponds to the data bus 270a and 270b. The data bus 270a is the path of data being written to the memory device 260, and the data bus 270b is the path of data being read from the memory device 260. Although separate buses 270a and 270b in some implementations (as shown in FIG. 2), in other implementations they can be the same (multiplexed read/write) data bus. The address bus 172 corresponds to the address bus 272.

The operations shown above the dashed line correspond to a write operation in which combined information (e.g., write data 202 with address information 201 superimposed) is written to the memory device 260. The operations shown below the dashed line correspond to a read operation in which combined information (e.g., write data 202 with address information 201 superimposed) is read from the memory device 260, and any error in read data 203 and the address information 201 are detected. If no errors occur in the data (e.g., no error flag 204), the write data 202 should be the same as the read data 203.

In some examples, the address information 201, denoted as A, has a translated version which can be generated for each memory read access/operation (e.g., shown above the dashed line in FIG. 2) and each memory write access/operation (e.g., shown below the dashed line in FIG. 2). In order to superimpose the address information 201 onto the write data 202, a width of the translated address information h(A) is matched with a width of the ECC encoded write data Du(A)e, given that in some examples, the width of the address information A 201 and the width of the ECC encoded write data Du(A)e do not match. The width of the address information A 201 corresponds to the width of the address bus 272. The width of the ECC encoded write data Du(A)e may correspond to the width of the data buses 270a and/or 270b, while in some examples they may differ. For example, for high-capacity DRAM systems (e.g., on a 64 GB DRAM), the address information 201 (and the address bus 272) has a width of 30 to 36 bits while the write data 202 (and the data buses 270a and/or 270b) may a width of 16/32/64 bits. The ECC encoded data will be dimensioned depending on the ECC codeword size. In some implementations this may match the data bus width, while in other implementations it may be smaller or larger.

In that regard, as shown, the address information A 201 is passed through a translation function h(A) 210 to match the width of the translated address information h(A) with the width of the ECC encoded write data Du(A)e (and the data buses 270a and/or 270b), such that the width of h(A) equals the width of the ECC encoded write data Du(A)e. In other words, the address information 201, denoted as A and have a first width, is inputted into the translation function 210. The output of the translation function 210 is the translated address information, denoted as h(A) and have a second width. The first width is the width of the address bus 272. The second width is the width of the data buses 270a and/or 270b. The first width is different from the second width. In some examples, the first width (e.g., 32 bits) is greater than the second width (e.g., 16 bits), as in one example involving the high-capacity DRAM system described above. The address information 201 is thus compressed using the translation function 210. In another example, the first width is less than the second width. In some arrangements, the translation function 210 is a function that generates an output having a fixed second width (e.g., a fixed number of bits).

In some arrangements, the translation function 210 is a hashing function. In particular, a non-cryptographic hashing function that accepts input in the first width and provides outputs in the second width using any suitable hashing algorithm can be employed. In the example in which the first width of the input address information 201 is 32 bits, the second width of the output address information (a hash of the input address information 201) is 16 bits. In other words, the translated version of the address information 201 is the hash of the input address information 201. An example of the hash function is a pipelined Fowler-Noll-Vo (FNV) 1a hash function. In some arrangements, the translation function 210 may have bit dispersing properties, one effect of which is that different values of A, even with small changes in the value of A (such as a few bits changing from 0 to 1 or vice versa) should give values of h(A) which are randomly dispersed among the value space of h(A). In this way, values of A that differ only in a few bit positions give rise to greatly differing values of h(A). This ensures that if the value of A is modified by errors in a few bit positions on bus 272 to a value A', then the translated values h(A) and h(A') are unlikely to be equal and more likely differ in value in many bit positions, increasing the likelihood of an ECC decoder error being detected.

In an example, a user view of the original address information 201 is 36-bit wide to cover the memory device 260 (e.g., a DRAM) having a size of 64 GB. This address information 201 is translated into DRAM rank, bank (group), row, and column addresses. These addresses are then aggregated into a single vector with a specific order to denote corresponding relevance. For instance, some bits applicable only in some configurations may have positions in the vector that indicate demotion. The top 32 bits of the vector are then used as the input to the translation function 210 (which is a hashing function).

In some arrangements, the translation function 210 is a parity function. In particular, a parity function that accepts the address information 201 as input and generates an odd or even parity bit of the address information 201 as output can be employed. The output of the party function is a single bit. Thus, in the example in which the translation function 210 is a parity function, the width (e.g., 1 bit) of the output of the translation function 210 is not the same as the width (e.g., 16 bits) of the write data 202 (or the width of the data bus).

In some arrangements, the translated version of the address information 201 is used for (e.g., combined with) all data bits in a complete burst to improve EMI, in the example in which the memory device 260 is SDRAM. In that regard, the write data 202 refers to all data bits in a burst, and the address information 201 refers to the address bits for all data bits in the burst.

In other arrangements, the translated version of the address information 201 can be regenerated at a granularity finer than a complete burst to spread the energy of data patterns. For instance, the translated version of the address information 201 can be generated for each beat, for each byte, and so on. In that regard, the write data 202 refers to all data bits in a beat or byte, and the address information 201 refers to the address bits for all data bits in the beat or byte.

The output of the translation function 210 can be passed through the delay queue 212. An example of the delay queue 212 is a delay FIFO. The delay queue 212 is configured to delay the output h(A) of the translation function 210 (e.g., the translated version of address information A 201) before being incorporated into data phase. The number of cycles of the address and write data phase (e.g., over the address bus 272 and write data bus 270a respectively) may be different to the number of cycles of the address and read data phases (e.g., over the address bus 272 and read data bus 270b respectively). Therefore, separate read delay queue 212 and write delay queue 216 are implemented. In addition, the number of cycles between the address phases and the data phases depend upon the configuration (e.g., speed bin, which affects read and write latencies, etc.) of the memory device 260 (e.g., the SDRAM). Accordingly, a FIFO scheme is implemented in the examples shown in FIG. 2, given that the FIFO can be de-queued a programmable number of cycles later and has fill levels and under/overrun detection built in. In some arrangements, a variable-length pipeline can be implemented as the delay queues 212 and 216, where the delay can be modified to automatically adjust for variations in the timings between address and data buses between different memory devices. In some arrangements in which with fixed latencies are known, a fixed-length pipeline can be implemented as the delay queues 212 and 216.

In some arrangements, the translated address information h(A) (output of the translation function 210) as delayed by the delay queue 212 can be combined with the write data 202 (denoted as Du(A)) just prior to egress from the entity (e.g., the controller 110) that performs the write to the memory device 260. In other words, the translated address information h(A) as delayed by the delay queue 212 can be combined with the write data 202 using a combine function 214 (sometimes referred to as the "first function") after a ECC has been generated by the ECC encoder 230. The write data 202 with ECC generated and appended thereto is denoted as Du(A)e. Thus, for a memory write operation, when the data phase corresponding to the write data 202 with the ECC appended thereto is due, the next translated address information h(A) in the delay queue 212 is de-queued, and the write data 202 with the ECC appended thereto and the next translated address information h(A) are inputted into the combine function 214 to determine combined information, before the combined information is pushed to the memory device 260 via the physical layer interface 250. The combined information is denoted as C{h(A),Du(A)e}.

An example of the combine function 214 include but are not limited to, an XOR function. Other examples of the combine function 214 include but are not limited to, XNOR, add, multiple, and so on. The combine function 214 is a bit-wise function, such that individual bits of h(A) are combined with the corresponding individual bits of Du(A)e to form the individual bits of the combined information C{h(A), Du(A)e}.

In the arrangement in which the output h(A) of the translation function 210 has a width that is the same as the width of the ECC encoded write data 202 (Du(A)e, the data buses 270a and/or 270b), the combine function 214 is performed on each bit of the write data 202 (with the ECC appended thereto) and a corresponding bit of the translated address information h(A). In the example in which the combine function 214 is an XOR function and the translation function 210 is a hashing function, the first bit of the write data 202 (with the ECC appended thereto) is XORed with the first bit of the translated address information h(A), the second bit of the ECC encoded version of the write data Du(A) (e.g. in the case of a systematic ECC code, the user data Du(A) with the ECC appended thereto) is XORed with the second bit of the translated address information h(A), . . . , and the last bit of the write data 202 (with the ECC appended thereto) is XORed with the last bit of the translated address information h(A).

In the arrangement in which the output of the translation function 210 has a width (e.g., by 1 bit) that is less than the width of the ECC encoded write data Du(A)e (the data bus 270a), the combine function 214 is performed on each bit of the translated address information h(A) and one or more or all of the bits of the write data 202 (with the ECC appended thereto). In the example in which the combine function 214 is an XOR function and the translation function 210 is a parity function, the single bit of the translated address information h(A) is selectively XORed with the first one or more bits of the write data 202 (with the ECC appended thereto), with the last one or more bits of the write data 202 (with the ECC appended thereto), with the odd bits of write data 202 (with the ECC appended thereto), with the even bits of the write data 202 (with the ECC appended thereto), and so on. The one or more or all of the bits of the write data 202 (with the ECC appended thereto) may be predetermined.

The combined information C{h(A),Du(A)e} is transferred to the memory device 260 for storage through the data bus 270a and via the physical layer interface 250. Given that the combine function 214 does not alter the width of the ECC encoded write data Du(A)e when superimposing the translated address information h(A) on the ECC encoded write data Du(A)e, the combined information C{h(A),Du(A)e} can be carried on the data bus 270a. The address information 201 is transferred to the memory device 260 through the address bus 272 and via the physical layer interface 250.

For a subsequent read operation after the combined information is stored in the memory device 260 in the write operation, the combined information C{h(A),Du(A)e} is read from the memory device 260 and transferred via the data bus 270b through the physical layer interface 250 to be an input to a de-combine function 218 (sometimes referred to as the "second function").

The output h(A) of the translation function 210, which is the translated version of address information A 201, can be passed through the delay queue 216. Examples of the delay queue 216 include but are not limited to, a delay FIFO, a variable-length pipeline, and a fix-length pipeline. The delay queue 216 is configured to delay the output h(A) of the translation function 210 before the de-combine function 218.

In some arrangements, the translated address information h(A) (output of the translation function 210) as delayed by the delay queue 216 can be removed (de-combined) from the combined information C{h(A),Du(A)e} to obtain an ECC encoded version of the read data 203. The ECC encoded version of the read data 203 is denoted as Du(A)e. In other words, the encoded version of the read data 203 is de-combined from the translated address information h(A) just after ingress into the entity (e.g., the controller 110) that performs the read operation. That is, the translated address information h(A) as delayed by the delay queue 216 can be de-combined from the encoded version of the read data 203 using the de-combine function 218 before any ECC has been decoded and checked by the ECC decoder 240. Thus, for a memory read operation, when the data phase corresponding to the combined information read from the memory device 260 is due, the next translated address information h(A) in the delay queue 216 is de-queued, and the combined information and the next translated address information h(A) are inputted into the de-combine function 218 to determine the encoded version of the read data 203, as the combined information is received through the physical layer interface 250.

In some examples, the de-combine function 218 is the inverse function of the combine function 214. In the example in which the combine function 214 is an XOR function, the de-combine function 218 is the same XOR function, given that the inverse function of an XOR function is the same XOR function. This reduces hardware cost.

In some examples, certain types of memory commands (e.g., SDRAM Multi-Purpose Register (MPR) reads, Per DRAM Addressability (PDA), MR Reads, and so on) may use the data buses 270a and 270b but do not relate to user memory writes/reads. For these types of commands, the combine function 214 and the de-combine function 218 are automatically disabled, because the command presented to the memory device 260 should not modified in any way in order for the command to be correctly interpreted in the memory device 260. In other words, in response to determining that the command is a predetermined type of command (e.g., commands other than read and write commands), the combine function 214 and the de-combine function 218 are automatically disabled. Automatically disabling the combine function 214 and the de-combine function 218 includes setting the input from the delay queue of the combine function 214 and the de-combine function 218 to 0, in the example in which the combine function 214 and the de-combine function 218 are an XOR function. This is because any value, when XOR'd with 0, gives a result which is the original value unchanged.

The output of the de-combine function 218, which is the encoded version of the read data 203, is passed through the ECC decoder 240 to be decoded and checked. The output is the read data 203, denoted as Du(A). The ECC decoder 240 can output an error flag 204 that indicates whether there is an error (e.g., one or more error bits which are uncorrectable by the ECC code) in the read data 203.

Accordingly, the scheme shown in FIG. 2 can detect errors induced in the address information 201 between the read/write initiator (e.g., the controller 110) and the memory device 260 that is carried over to the physical layer interface 250.

In one scenario, write data 202 Du(A) (e.g., user data to address A) which has ECC applied by the ECC encoder 230 becomes Du(A)e. The translated address information h(A) combined with Du(A)e becomes C{h(A),Du(A)e} and is written into the memory device 260 at address A, as:

$$Dw(A)=C\{h(A),Du(A)e\} \quad (1),$$

where Dw(A) refers to data written to the memory device 260 at the address A and C() is the combine function. The memory device 260 is later read in a read operation at the address A, which returns data expressed as:

$$Dr(A)=C\{h(A),Du(A)e\} \quad (2),$$

where Dr(A) refers to data read from the memory device 260 at the address A. The de-combine function removes the translated address h(A) from C{h(A),Du(A)e} to yield Du(A)e, which can be expressed as:

$$Du(A)e=DC\{h(A),C\ h(A),Du(A)e\} \quad (2b),$$

where C{ } and DC{ } are combine and de-combine functions respectively such that x being combined with y and the result being de-combined with y to yield x again can be expressed as:

$$x=DC\{y,C\{y,x\}\} \quad (2c).$$

The ECC decoder 240 decodes and checks the ECC. In response to determining that no error is present, read data 203 Du(A) is returned back to the user (error flag 204 indicates no error, or no error flag 204 is raised).

In another scenario, write data 202 Du(A) (e.g., user data to address A) which has ECC applied by the ECC encoder 230 becomes Du(A)e. The translated address information h(A) combined with Du(A)e becomes C{h(A),Du(A)e} and is written into the memory device 260 at address A, as Dw(A) shown in expression (1). The memory device 260 is later read in a read operation at the address A, which becomes corrupted at the physical layer interface 250 during the read operation. The corrupted address A is denoted as A', assumed in this scenario to have a single-bit error. The read returns data expressed as:

$$Dr(A')=C\{h(A'),Du(A')e\} \quad (3),$$

with the assumption that some data C{h(A'), Du(A')e} was previously written correctly to location at address A'. When the translated correct address h(A) is removed by the de-combine function 218 evaluating DC{h(A),C{h(A'), Du(A')e}}, the result is E{Du(A')e} (an erroneous version of Du(A')e, since the value h(A) will, by design, vary greatly or on average in half of the bit positions from the value h(A'), therefore for example, where the de-combine function is XOR, the result will contain errors in half the bit positions). The ECC decoder 240 decodes and checks the ECC. The outcome of the ECC decoder 240 depends on the ECC scheme as described herein, but the desired outcome is that the ECC decoder 240 will produce an error flag 204.

In another scenario, write data 202 Du(A) (e.g., user data to address A) which has ECC applied by the ECC encoder 230 becomes Du(A)e. The translated address information h(A) combined with Du(A)e becomes C{h(A),Du(A)e}. The address A becomes corrupted on the physical layer interface 250 in the write operation. The corrupted address A is denoted as A', assumed in this scenario to have a single-bit error. The combined information is written into the memory device 260 at address A', as:

$$Dw(A')=C\{h(A),Du(A)e\} \quad (4),$$

where Dw(A') refers to data written to the memory device 260 at the address A'. In response to the memory device 260 being subsequently read in a read operation at the address A, the data returned is the previous contents of the location A, This will not cause any errors after the data is de-combined, but the data will not be the correct (expected) data. However, if the memory device 260 is subsequently read in a read operation at the address A', this returns data expressed as:

$$Dr(A')=C\{h(A),Du(A)e\} \quad (5).$$

The translated address h(A') is removed by the de-combine function 218 yielding the result expressed as:

$$E\{Du(A)e\}=DC\{h(A'),C\{h(A),Du(A)e\} \quad (6),$$

which is an erroneous version of Du(A)e, because the value h(A') will, by design, differ from the value h(A), depending on the translation function h( ) chosen. In the case of a dispersing hash function for example, h(A) and h(A') will, on average, differ in half of the bit positions, such that where the de-combine function is XOR, the result E{Du(A)e} will contain errors in half the bit positions. The ECC decoder 240 decodes and checks the ECC. The outcome of the ECC decoder 240 depends on the ECC scheme as described herein, but the desired outcome is that the ECC decoder 240 will produce an error flag 204.

In the example in which an error in the address information 201 is induced in the read data 203 itself prior to ECC decoding/checking at the ECC decoder 240, the outcome of the ECC decoder 240 depends on the ECC scheme and the characteristics of the translation function 210.

In the arrangements in which the ECC implemented by the ECC encoder 230 and the ECC decoder 240 is a Single-Error Correcting and Double-Error Detecting (SECDED) code, if the difference between h(A) and h(A') causes a two-bit error in Du(A)e, the ECC decoder 240 outputs the error flag 204 indicating an uncorrectable error. In this case, the error in the address information 201 has been detected.

In the arrangements in which the ECC implemented by the ECC encoder 230 and the ECC decoder 240 is a SECDED code, if the difference between h(A) and h(A') causes two or more bits in error, the ECC decoder 240 may output the error flag 204 indicating the errors as uncorrectable, or may output the error flag 204 indicating that the errors as correctable and returns mis-corrected data.

In some arrangements, the translation function 210 is selected to maximize the likelihood of uncorrectable errors being detected for an expected numbers of address errors. In the example in which the ECC implemented by the ECC encoder 230 and the ECC decoder 240 is a SECDED code and assume that the likelihood of two or more error bits is extremely small, the translation function 210 is selected to result in 2-bit difference between h(A) and h(A') when there is a 1-bit difference between A and A'. This allows all single bit address errors (which are the most likely) to be at least detected. For example, the translation function 210 can be a parity function, and the combine function 214 is an XOR function in which the parity bit determined in the parity function is XORed into an exact number of data bits per ECC frame of the write data 202 that have errors detected but not corrected. The exact number of data bits per ECC frame can be 2 data bits for Double Error Detection (DED) and 3 data bits for Triple Error Detection (TED). Any single-bit error on the address information 201 results in the correct number of bit flips such that an uncorrectable error will be flagged by the ECC decoder 240.

In some arrangements, superimposing the address information 201 can spread the energy of a fixed data pattern in an address range. In the example in which a data pattern that results in the maximum toggle of all data bus signals is block filled through an address range, then during that fill process, defined spikes in the frequency spectrum of each Data (DQ) signal may occur, and EMI may be caused. As the address information 201 changes sequentially through the fill range, the address information 201 also has a set of frequency spikes. By combining the write data 202 and the address information 201, the amplitude of the max toggle data frequency spike can be spread across a wider set of frequencies with lower individual amplitudes, thus reducing the radiated EMI. Further, by including the translation function 210 on the address information 201 before combining with the write data 202, the resultant data pattern of the combined information is even less regular and further serves to spread the energy spikes across the frequency spectrum, thus further reducing the radiated EMI.

Figure 3:
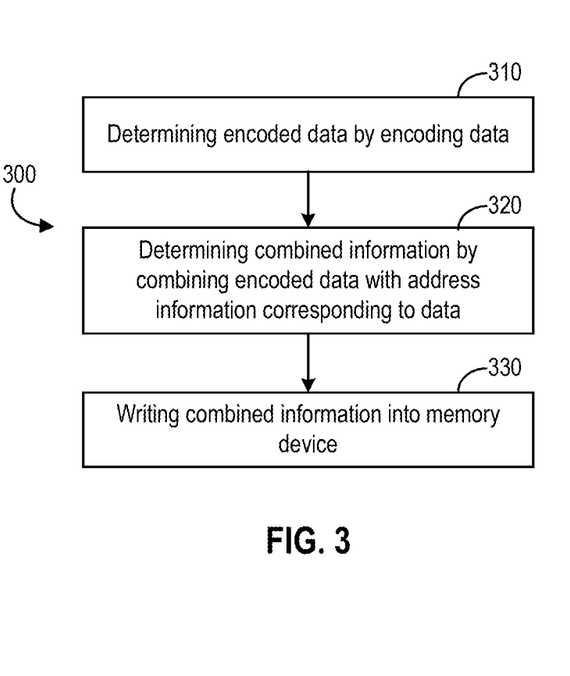
FIG. 3 is a flowchart diagram illustrating an example method for detecting address corruption when using a memory device to store data, according to some implementations.

FIG. 3 is a flowchart diagram illustrating an example method 300 for detecting address corruption when using a memory device to store data, according to some implementations. Referring to FIGS. 1-3, the method 300 can be implemented using the systems 100 and 200. The method 300 relates to storing data to enable detection of address corruption, when subsequently read according to the method 400 shown in FIG. 4.

At 310, the controller 110 determines encoded data (e.g., Du(A)e) by encoding data (e.g., Du(A)). At 320, the controller 110 determines combined information (e.g., C{h(a), Du(A)e}) by combining the encoded data with address information or a translated version thereof (e.g., h(A)) corresponding to the data. At 330, the controller 110 writes the combined information into the memory device 260.

Figure 4:
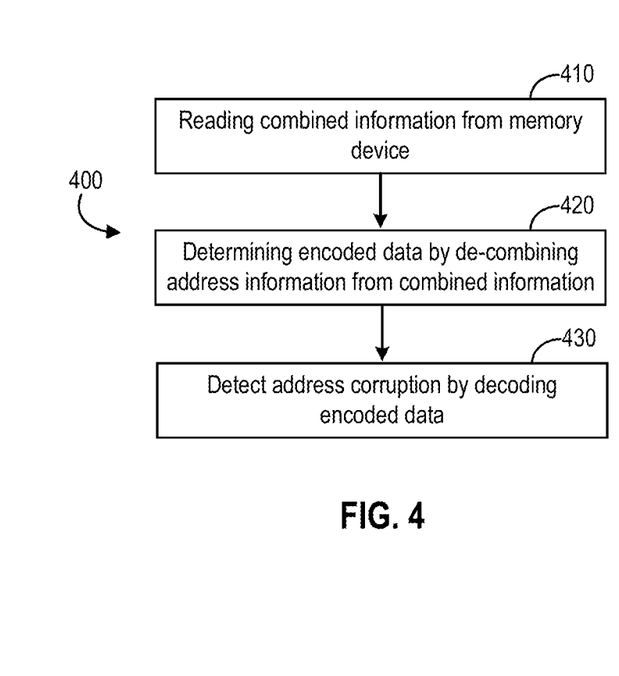
FIG. 4 is a flowchart diagram illustrating an example method for detecting address corruption when using a memory device to store and retrieve data, according to some implementations.

FIG. 4 is a flowchart diagram illustrating an example method 400 for detecting address corruption when using a memory device to retrieve data, according to some implementations. Referring to FIGS. 1-4, the method 400 can be implemented using the systems 100 and 200.

At 410, the controller 110 reads the combined information from the memory device 260. At 420, the controller 110 determines encoded data by de-combining the address information from the combined information. At 430, the controller 110 detects address corruption by decoding the encoded data.

In some arrangements, the data is encoded using one or more ECCs to determine the encoded data. The encoded data is decoded using the one or more ECCs to determine the data.

In some arrangements, the data is encoded before the encoded data and the address information is combined. The encoded data is decoded after the address information is de-combined from the combined information.

In some arrangements, the address information is passed through a translation function (e.g., the translation function 210) before being combined with the encoded data. In some examples, the address information inputted into the translation function has a first width. The address information outputted from the translation function has a second width. The first width is different from the second width. In some examples, the translation function is one of a non-cryptographic hashing function or a parity function. In some examples, the translation function is a function with bit-dispersal properties.

In some arrangements, the address information is passed through a delay queue (e.g., the delay queue 212) before being combined with the encoded data. In some examples, the delay queue is one of a delay First In First Out (FIFO), a variable-length pipeline, or a fixed-length pipeline. In some examples, combining the encoded data with the address information includes superimposing the address information unto the encoded data using a first function (e.g., the combine function 214). The address information and the encoded data are inputs to the first function, and the combined information is the output of the first function.

In some examples, separating the encoded data from the address information includes de-combining the address information from the combined information based on a second function (e.g., the de-combine function 218). The address information and the combined information are inputs to the second function, and the encoded data is the output of the second function.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical drive storage, magnetic drive storage or other magnetic storages, or any other medium that may be used to store desired program code in the form of instructions or data structures and that may be accessed by a computer. Drive and disc, as used herein, includes compact disc (CD), laser disc, optical disc, digital versatile disc (DVD), floppy drive, and blu-ray disc where drives usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method, comprising:
   reading combined information from a memory device, wherein the combined information comprises encoded data together and combined with address information;
   determining encoded data by de-combining the address information from the combined information that was read from the memory device at an address of the memory device corresponding to the address information; and
   detecting address corruption by decoding the encoded data.

2. The method of claim 1, further comprising:
   determining the encoded data by encoding data;
   determining combined information by combining the encoded data with address information corresponding to the data; and
   writing the combined information into a memory device.

3. The method of claim 2, wherein
   the data is encoded using one or more Error Correction Codes (ECCs) to determine the encoded data;
   the encoded data is decoded using the one or more ECCs to determine the data.

4. The method of claim 2, wherein
   the data is encoded before the encoded data and the address information is combined; and
   the encoded data is decoded after the address information is de-combined from the combined information.

5. The method of claim 2, wherein the address information is passed through a translation function before being combined with the encoded data.

6. The method of claim 5, wherein
   the address information inputted into the translation function has a first width;
   the address information outputted from the translation function has a second width; and
   the first width is different from the second width.

7. The method of claim 5, wherein the translation function is one of a non-cryptographic hashing function or a parity function.

8. The method of claim 2, wherein the address information is passed through a delay queue before being combined with the encoded data.

9. The method of claim 8, wherein the delay queue is one of a delay First In First Out (FIFO), a variable-length pipeline, or a fixed-length pipeline.

10. The method of claim 2, wherein combining the encoded data with the address information comprises superimposing the address information unto the encoded data using a first function, the address information and the encoded data being inputs to the first function, and the combined information being the output of the first function.

11. The method of claim 1, wherein de-combining the address information from the combined information is based on a second function, the address information and the combined information being inputs to the second function, and the encoded data being the output of the second function.

12. The method of claim 1, wherein de-combining the address information from the combined information includes obtaining the encoded data after the address information is removed from the combined information.

13. A non-transitory processor-readable medium comprising processor-readable instructions, such that, when executed by at least one processor of a controller, causes the processor to:
   read combined information from a memory device, wherein the combined information comprises encoded data together and combined with address information;
   determine encoded data by de-combining address information from the combined information that was read from the memory device at an address of the memory device corresponding to the address information; and
   detect address corruption by decoding the encoded data.

14. The non-transitory processor-readable medium of claim 13, wherein the processor is further caused to:
   determine the encoded data by encoding data;
   determine combined information by combining the encoded data with address information corresponding to the data; and
   write the combined information into a memory device.

15. The non-transitory processor-readable medium of claim 14, wherein the data is encoded using one or more Error Correction Codes (ECCs) to determine the encoded data;
   the encoded data is decoded using the one or more ECCs to determine the data.

16. The non-transitory processor-readable medium of claim 14, wherein
   the data is encoded before the encoded data and the address information is combined; and
   the encoded data is decoded after the address information is de-combined from the combined information.

17. The non-transitory processor-readable medium of claim 14, wherein the address information is passed through a translation function before being combined with the encoded data.

18. The non-transitory processor-readable medium of claim 17, wherein
the address information inputted into the translation function has a first width;
the address information outputted from the translation function has a second width; and
the first width is different from the second width.

19. The non-transitory processor-readable medium of claim 14, wherein the address information is passed through a delay queue before being combined with the encoded data.

20. The non-transitory processor-readable medium of claim 14, wherein
combining the encoded data with the address information comprises superimposing the address information unto the encoded data using a first function, the address information and the encoded data being inputs to the first function, and the combined information being the output of the first function; and
de-combining the address information from the combined information is based on a second function, the address information and the combined information being inputs to the second function, and the encoded data being the output of the second function.

21. A storage device, comprising:
a memory device;
a controller configured to:
read combined information from a memory device, wherein the combined information comprises encoded data together and combined with address information;
determine encoded data by de-combining address information from the combined information that was read from the memory device at an address of the memory device corresponding to the address information; and
detect address corruption by decoding the encoded data.

* * * * *